United States Patent
Stevens et al.

(10) Patent No.: US 9,894,776 B2
(45) Date of Patent: Feb. 13, 2018

(54) SYSTEM FOR REFURBISHING OR REMANUFACTURING AN ELECTRONIC DEVICE

(71) Applicant: HzO, Inc., Draper, UT (US)

(72) Inventors: Blake Stevens, Morristown, NJ (US); Max Sorenson, Cottonwood Heights, UT (US); Scott B. Gordon, Salt Lake City, UT (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 14/157,780

(22) Filed: Jan. 17, 2014

(65) Prior Publication Data

US 2014/0190000 A1 Jul. 10, 2014

Related U.S. Application Data

(63) Continuation of application No. PCT/US2014/010638, filed on Jan. 8, 2014.
(Continued)

(51) Int. Cl.
*H05K 3/30* (2006.01)
*H05K 13/04* (2006.01)
(Continued)

(52) U.S. Cl.
CPC .............. *H05K 3/30* (2013.01); *H05K 3/225* (2013.01); *H05K 13/0486* (2013.01);
(Continued)

(58) Field of Classification Search
USPC ..... 29/705, 711, 721, 729; 228/175, 180.22, 228/219
See application file for complete search history.

(56) References Cited

U.S. PATENT DOCUMENTS 3,661,641 A * 5/1972 Vigh et al. .......................... 134/6
3,670,091 A * 6/1972 Frantz et al. ................. 174/524
(Continued)

FOREIGN PATENT DOCUMENTS

CN 1826710 A 8/2006
CN 101442896 A 5/2009
(Continued)

OTHER PUBLICATIONS

United States Patent and Trademark Office, Acting as the International Searching Authority, "International Search Report and Written Opinion," dated Apr. 24, 2014, in PCT application No. PCT/US2014/010638.
(Continued)

*Primary Examiner* — Paul D Kim
(74) *Attorney, Agent, or Firm* — Kunzler, PC

(57) ABSTRACT

An approach to refurbishing or remanufacturing an electronic device may involve exposing electrical components that are situated within an interior of the electronic device. The approach may also involve replacing one or more defective electronic components of the electronic device with one or more replacement components and applying a protective coating to at least a portion of the interior of the electronic device. The protective coating may cover the circuit board and the electronic components it carries. The protective coating may also cover at least some of the electrical connections of the electronic device. The protective coating may also be applied to the replacement component prior to reassembly. The resulting refurbished or remanufactured electronic device may thus be provided with moisture resistance to help protect the electronic device from damage caused by exposure to moisture.

25 Claims, 5 Drawing Sheets

200

Diagnosis Element 202 | Repair Element 204 | Coating Station 206 | Assembly Element 208 | Validation Element 210

Related U.S. Application Data

(60) Provisional application No. 61/750,354, filed on Jan. 8, 2013.

(51) Int. Cl.
*H05K 3/22* (2006.01)
*H05K 3/28* (2006.01)

(52) U.S. Cl.
CPC ............ *H05K 3/284* (2013.01); *H05K 3/288* (2013.01); *H05K 2203/176* (2013.01); *Y10T 29/49002* (2015.01); *Y10T 29/49004* (2015.01); *Y10T 29/4913* (2015.01); *Y10T 29/53174* (2015.01); *Y10T 29/53274* (2015.01)

(56) References Cited

U.S. PATENT DOCUMENTS

| | | | |
|---|---|---|---|
| 4,059,708 A | 11/1977 | Heiss, Jr. et al. | |
| 4,234,357 A | 11/1980 | Scheppele | |
| 4,254,174 A | 3/1981 | Flanders et al. | |
| 4,255,469 A | 3/1981 | McGinness | |
| 4,300,184 A | 11/1981 | Colla | |
| 4,495,254 A | 1/1985 | Hoffman | |
| 4,631,250 A | 12/1986 | Hayashi | |
| 4,784,310 A | 11/1988 | Metzger et al. | |
| 4,814,943 A | 3/1989 | Okuaki | |
| 5,009,311 A | 4/1991 | Schenk | |
| 5,024,879 A | 6/1991 | Massa et al. | |
| 5,102,712 A | 4/1992 | Peirce et al. | |
| 5,176,312 A | 1/1993 | Lowenthal | |
| 5,184,427 A | 2/1993 | Armstrong | |
| 5,188,669 A | 2/1993 | Donges et al. | |
| 5,246,730 A | 9/1993 | Peirce et al. | |
| 5,271,953 A | 12/1993 | Litteral | |
| 5,456,955 A | 10/1995 | Muggli | |
| 5,536,282 A | 7/1996 | Yoon et al. | |
| 5,543,008 A | 8/1996 | Hidber et al. | |
| 5,587,207 A | 12/1996 | Gorokhovsky | |
| 5,888,308 A | 3/1999 | Sachdev et al. | |
| 5,925,069 A | 7/1999 | Graves et al. | |
| 6,060,683 A | 5/2000 | Estrada | |
| 6,138,349 A | 10/2000 | Vinciarelli et al. | |
| 6,280,821 B1 | 8/2001 | Kadunce et al. | |
| 6,306,688 B1 | 10/2001 | Lunceford | |
| 6,447,847 B1 | 9/2002 | Hynes et al. | |
| 6,592,018 B2 | 7/2003 | Taylor et al. | |
| 6,635,510 B1 | 10/2003 | Kraft et al. | |
| 6,635,553 B1 | 10/2003 | Distefano et al. | |
| 6,697,217 B1 | 2/2004 | Codilian | |
| 6,793,544 B2* | 9/2004 | Brady et al. ................. | 439/886 |
| 6,940,022 B1 | 9/2005 | Vinciarelli et al. | |
| 6,956,963 B2* | 10/2005 | Ulrich et al. ................. | 382/154 |
| 6,980,647 B1* | 12/2005 | Daugherty et al. ........... | 379/412 |
| 7,066,582 B2* | 6/2006 | Deguchi ............... | B41J 2/1606 |
| | | | 347/64 |
| 7,109,055 B2 | 9/2006 | McDonald et al. | |
| 7,273,767 B2 | 9/2007 | Ong et al. | |
| 7,632,698 B2 | 12/2009 | Hooper et al. | |
| 7,681,778 B2 | 3/2010 | Gottshall et al. | |
| 7,897,881 B2 | 3/2011 | Kaspar et al. | |
| 8,002,948 B2 | 8/2011 | Haubrich et al. | |
| 8,408,379 B2* | 4/2013 | Malek et al. ................. | 198/403 |
| 8,544,781 B2* | 10/2013 | Pan et al. ................. | 241/101.2 |
| 2002/0088636 A1 | 7/2002 | Noguchi et al. | |
| 2002/0170897 A1 | 11/2002 | Hall | |
| 2002/0187260 A1 | 12/2002 | Sheppard et al. | |
| 2003/0143845 A1 | 7/2003 | Mori et al. | |
| 2004/0056039 A1 | 3/2004 | Sarajian | |
| 2004/0058070 A1 | 3/2004 | Takeuchi et al. | |
| 2004/0065554 A1 | 4/2004 | Cohen | |
| 2004/0100164 A1 | 5/2004 | Murata et al. | |
| 2005/0008848 A1 | 1/2005 | Saccomanno et al. | |
| 2005/0081354 A1* | 4/2005 | Motzno et al. ............. | 29/402.12 |
| 2005/0179140 A1 | 8/2005 | Goodner et al. | |
| 2006/0013961 A1 | 1/2006 | Fournier et al. | |
| 2006/0042659 A1 | 3/2006 | Fernandez et al. | |
| 2006/0199408 A1 | 9/2006 | Hoisington et al. | |
| 2006/0264153 A1 | 11/2006 | Jaubertie | |
| 2007/0087131 A1 | 4/2007 | Hutchinson et al. | |
| 2007/0095368 A1 | 5/2007 | Girard et al. | |
| 2007/0157457 A1 | 7/2007 | Fried | |
| 2007/0206365 A1 | 9/2007 | Shiu et al. | |
| 2007/0246820 A1 | 10/2007 | Zohni et al. | |
| 2008/0147158 A1 | 6/2008 | Zweber et al. | |
| 2008/0283180 A1 | 11/2008 | Bachman et al. | |
| 2009/0263581 A1 | 10/2009 | Martin, III et al. | |
| 2009/0263641 A1 | 10/2009 | Martin, III et al. | |
| 2009/0283574 A1 | 11/2009 | Okazaki et al. | |
| 2009/0301770 A1 | 12/2009 | Cho et al. | |
| 2009/0304549 A1 | 12/2009 | Coulson | |
| 2010/0124010 A1 | 5/2010 | Shiu et al. | |
| 2010/0159699 A1 | 6/2010 | Takahashi | |
| 2010/0203347 A1 | 8/2010 | Coulson | |
| 2010/0277921 A1 | 11/2010 | Sekowski et al. | |
| 2010/0293812 A1 | 11/2010 | Coulson | |
| 2011/0090658 A1 | 4/2011 | Adams et al. | |
| 2011/0094514 A1 | 4/2011 | Rakow et al. | |
| 2011/0141205 A1 | 6/2011 | Gerner et al. | |
| 2011/0231002 A1* | 9/2011 | Vienot et al. ................. | 700/110 |
| 2011/0253429 A1 | 10/2011 | Humphries et al. | |
| 2011/0262740 A1 | 10/2011 | Martin, III et al. | |
| 2012/0070145 A1 | 3/2012 | Wong et al. | |
| 2012/0146212 A1 | 6/2012 | Daubenspeck et al. | |
| 2012/0193648 A1 | 8/2012 | Donofrio et al. | |
| 2012/0296032 A1 | 11/2012 | Legein et al. | |
| 2013/0174410 A1 | 7/2013 | Stevens et al. | |
| 2013/0176691 A1 | 7/2013 | Stevens et al. | |
| 2013/0176700 A1 | 7/2013 | Stevens et al. | |
| 2013/0251889 A1 | 9/2013 | Cox et al. | |
| 2013/0286567 A1* | 10/2013 | Sorenson ................. | C23C 16/02 |
| | | | 361/679.01 |
| 2013/0335898 A1 | 12/2013 | Stevens et al. | |

FOREIGN PATENT DOCUMENTS

| | | |
|---|---|---|
| CN | 102150480 A | 8/2011 |
| CN | 102171852 A | 8/2011 |
| CN | 102655949 A | 9/2012 |
| EP | 0 350 031 B1 | 9/1993 |
| EP | 0 474 194 B1 | 1/1997 |
| JP | 62-248228 | 10/1987 |
| JP | 07-302808 A | 11/1995 |
| JP | 2000-299066 A | 10/2000 |
| JP | 2002-043702 A | 2/2002 |
| JP | 2005-079225 A | 3/2005 |
| JP | 2005-172083 A | 6/2005 |
| JP | 2005-260106 A | 9/2005 |
| JP | 2007-279616 A | 10/2007 |
| JP | 2008-018476 A | 1/2008 |
| JP | 2009-505386 A | 2/2009 |
| JP | 2009-178805 A | 8/2009 |
| JP | 2009-292135 A | 12/2009 |
| JP | 2010-225715 A | 10/2010 |
| JP | 2012-500487 A | 1/2012 |
| WO | WO-2007/138302 A1 | 12/2007 |
| WO | WO-2010/020753 A2 | 2/2010 |
| WO | WO-2011/037921 A1 | 3/2011 |
| WO | 2011/089009 A1 | 7/2011 |
| WO | WO-2012/106109 A1 | 8/2012 |
| WO | WO-2013/106442 A1 | 7/2013 |
| WO | PCT/US14/10510 | 1/2014 |
| WO | WO-2014/110039 A2 | 7/2014 |
| WO | WO-2014/110106 A1 | 7/2014 |

OTHER PUBLICATIONS

United States Patent and Trademark Office, "International Search Report and Written Opinion" dated Nov. 29, 2013 in PCT application No. PCT/US2013/046392.
United States Patent and Trademark Office acting as the International Searching Authority, "International Search Report and Writ-

(56) References Cited

OTHER PUBLICATIONS ten Opinion," dated Dec. 2, 2013, in related International application No. PCT/US2013/046371.
United States Patent and Trademark Office. As the International Searching Authority, "International Search Report and Written Opinion," dated Mar. 13, 2013, in related international application No. PCT/US2013/020850.
United States Patent and Trademark Office. As the International Searching Authority, "International Search Report and Written Opinion" dated Apr. 30, 2014 in related international application No. PCT/US2014/010526.
Chinese State Intellectual Property Office, "Notification of the First Office Action and Search Report," dated Mar. 25, 2015 in Chinese application No. 201480000037.2.
Christina Schmiedel et al., "Combined Plasma Laser Removal of Parylene Coatings," ISPC Conference, 2009, Bochum, Germany, accessible online www.ispc-conference.org/ispcproc/papers/239.pdf.
Chinese State Intellectual Property Office, "Notification of the First Office Action and Search Report," dated Jun. 2, 2015 in Chinese application No. 201480000038.7.
Chinese State Intellectual Property Office, "Notification of the Second Office Action and Search Report," dated Apr. 4, 2016 in Chinese application No. 201480000038.7.

European Search Report for EP14700800.7, dated Oct. 14, 2015.
Office Action for Japanese Patent Application No. 2014-556841, dated Oct. 23, 2015.
PCT patent application PCT/US14/10638 filed on an IDS as a foreign reference on Jan. 17, 2014, but considered a NPL by the USPTO.
United States Patent and Trademark Office acting as the International Searching Authority, "International Search Report and Written Opinion," dated Mar. 13, 2013, in PCT application No. PCT/US2013/020850.
United States Patent and Trademark Office acting as the International Searching Authority, "International Search Report and Written Opinion," dated Nov. 29, 2013 in corresponding application No. PCT/US2013/046392.
United States Patent and Trademark Office acting as the International Searching Authority, "International Search Report and Written Opinion," dated Apr. 30, 2014, in related PCT application No. PCT/US2014/010526.
United States Patent and Trademark Office Acting as the International Searching Authority, "International Search Report and Written Opinion," dated Aug. 21, 2014 in related international application No. PCT/US2014/010510.

* cited by examiner

SYSTEM FOR REFURBISHING OR REMANUFACTURING AN ELECTRONIC DEVICE

CROSS-REFERENCE TO RELATED APPLICATION

This application is a continuation of International Patent Application No. PCT/US2014/010638, which was filed pursuant to the Patent Cooperation Treaty on Jan. 8, 2014, titled SYSTEMS AND METHODS FOR PROVIDING REFURBISHED OR REMANUFACTURED ELECTRONIC DEVICES WITH MOISTURE-RESISTANT COATINGS ("the '638 PCT Application"). The '638 PCT Application claims the benefit of the Jan. 8, 2013, filing date of U.S. Provisional Patent Application No. 61/750,354, titled SYSTEMS AND METHODS FOR PROVIDING REFURBISHED OR REMANUFACTURED ELECTRONIC DEVICES WITH WATER-RESISTANT COATINGS. The entire disclosure of each of the foregoing patent applications is hereby incorporated herein.

TECHNICAL FIELD

This disclosure relates generally to systems and methods for refurbishing or remanufacturing electronic devices, including portable and wearable consumer electronic devices, medical devices, industrial electronic devices, and, more specifically, to systems and methods in which electronic devices are imparted with internal moisture resistance as part of a refurbishing or remanufacturing process. Even more specifically, this disclosure relates to systems and methods for forming protective coatings, including moisture-resistant coatings, on interior surfaces of refurbished electronic devices.

BACKGROUND

Manufacturers may identify defective electronic devices before shipping them to resellers or end users. The defective electronic devices are sometimes remanufactured to eliminate the defect, then resold—typically at a discounted price.

Sellers and manufacturers of electronic devices receive damaged electronic devices back from consumers. A consumer may damage an electronic device during the warranty period in a manner protected by the warranty, or the electronic device may otherwise develop a fault during the warranty period. In other instances, the consumer trades in the electronic device or sells the electronic device in order to upgrade to a new electronic device. Oftentimes, the manufacturer, or a third-party, will repair the damage and/or upgrade the features and sell the repaired electronic device as a refurbished or remanufactured electronic device. Even after repair, however, the electronic device remains susceptible to damage from moisture.

SUMMARY

In various aspects, a system for imparting a refurbished or remanufactured electronic device with moisture resistance may include a diagnosis element for identifying one or more defective electronic components within an electronic device (e.g., a portable electronic device, a wearable electronic device, a medical device, an industrial electronic device, etc.). A receiving element may receive a subassembly of the electronic device, which subassembly comprises a plurality of electronic components. In one embodiment, the subassembly may include the circuit board of the electronic device and one or more surface mount technology (SMT) electronic components. In other embodiments, the subassembly may include a flexible material on which electronic components are mounted. The flexible material may include printed connectors or wires. Defective electronic components may be removed before the receiving element receives the subassembly. The defective electronic components may be removed and replaced before application of a protective coating to the subassembly.

The protective materials applied to surfaces of an electronic device or a subassembly of an electronic device may impart at least a portion of the electronic device with moisture resistance. As used herein, the term "protective coating" includes moisture-resistant coatings or films, as well as other coatings or films that protect various parts of an electronic assembly from moisture and/or other external influences. While the term "moisture-resistant coating" is used throughout this disclosure, in many, if not all, circumstances, a moisture-resistant coating may comprise or be substituted with a protective coating that protects coated components and/or features from other external influences. The term "moisture-resistant" refers to the ability of a coating to prevent exposure of a coated element or feature to moisture. A moisture-resistant coating may resist wetting or penetration by one or more types of moisture, or it may be impermeable or substantially impermeable to one or more types of moisture. A moisture-resistant coating may repel one or more types of moisture. In some embodiments, a moisture-resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc.). Use of the term "moisture-resistant" to modify the term "coating" should not be considered to limit the scope of materials from which the coating protects one or more components of an electronic device. The term "moisture-resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components.

A coating element may apply a protective coating to at least a portion of the subassembly, including over electrical connections of the subassembly. The coating element may apply the protective coating to all of the electronic components on the subassembly, or to at least the location of the subassembly where the replacement electronic component is located. The coating element may also apply a protective coating to an exterior and/or interior of the refurbished or remanufactured electronic device.

Some non-limiting examples of processes that may be used to apply a protective coating to the subassembly include chemical vapor deposition (CVD), molecular diffusion, physical vapor deposition (PVD) (e.g., evaporation deposition (including, but not limited to e-beam evaporation, sputtering, laser ablation, pulsed laser deposition, etc.), atomic layer deposition (ALD), and physical application processes (e.g., dipping, printing, spray-on techniques, rolling, brushing, etc.) and the like.

The coating element may include an apparatus for depositing a polymer coating onto at least a portion of the subassembly by way of a suitable process (e.g., CVD, PVD, ALD, a physical application process, etc.). The apparatus may be a molecular diffusion apparatus, a deposition apparatus for forming reactive species that polymerize on the subassembly, or any other suitable apparatus. The deposition apparatus may vaporize at least one type of [2,2] paracyclophane, to pyrolyze the [2,2] paracyclophane to form p-xylylene intermediates and to enable the p-xylylene intermediates to polymerize on the subassembly to form a poly(p-xylylene) on the subassembly.

In some embodiments, the system includes a masking element for masking areas of the exterior or interior where the protective coating is not desired. The system may also include a surface treatment element located upstream from the coating element. The surface treatment element may enhance adhesion of the protective coating to at least a portion of the subassembly.

Similarly, the system may include a material removal element downstream from the coating element to enable removal of one or more portions of a protective coating on locations where a protective coating is not desired. A material removal element may be configured to selectively remove each undesired portion of the protective coating.

In some instances, the electronic device may already include a protective coating on the subassembly. The system may include a material removal element that removes at least a portion of an existing protective coating from the subassembly. The material removal element may, for example, remove a portion of the existing protective coating from the subassembly at the location of a defective electronic component.

Also disclosed is a method for providing a refurbished or remanufactured electronic device with a protective coating. The method may involve exposing one or more electronic components within an interior of the electronic device by, for example, removing at least a portion of the housing for the electronic device. The method may also involve replacing one or more defective electronic components with replacement electronic components. The method may further involve applying a protective coating to at least a portion of the interior of the electronic device, including over one or more electrical connections of the electronic device. In certain embodiments, the replacement electronic components are treated with the protective coating prior to replacing the defective electronic components. In such embodiments, a subsequent application of a protective coating may ensure that the protective coating is applied to the intermediate conductive elements (such as solder) that electrically couple the conductive elements of a circuit board with the conductive elements of the electronic component.

The method may also involve removing at least a portion of an existing protective coating from electronic components of the electronic device. The removal may be restricted to removing the protective coating from the conductive elements of the circuit board associated with the defective electronic components. The method may involve connecting the replacement electronic components to the newly-exposed conductive elements of the circuit board and applying the protective coating to cover the intermediate conductive elements, the conductive elements of the circuit board, and the conductive elements of the electronic component. In certain embodiments, the protective coating is applied to substantially cover the surface of the circuit board, the electronic components carried by the surface of the circuit board, and the intermediate conductive elements extending across the surface of the circuit board.

Other aspects, as well as features and advantages of various aspects, of the disclosed subject matter will become apparent to those of skill in the art through consideration of the ensuing description, the accompanying drawings and the appended claims.

DETAILED DESCRIPTION

A system that incorporates teachings of the present invention includes one or more coating elements. Each coating element of such a system is configured to apply a protective coating to surfaces of one or more components of an electronic device. Because of its moisture resistance, or hydrophobicity, the coating may prevent electrical shorting and/or corrosion of one or more components of the electronic device.

Figure 1:
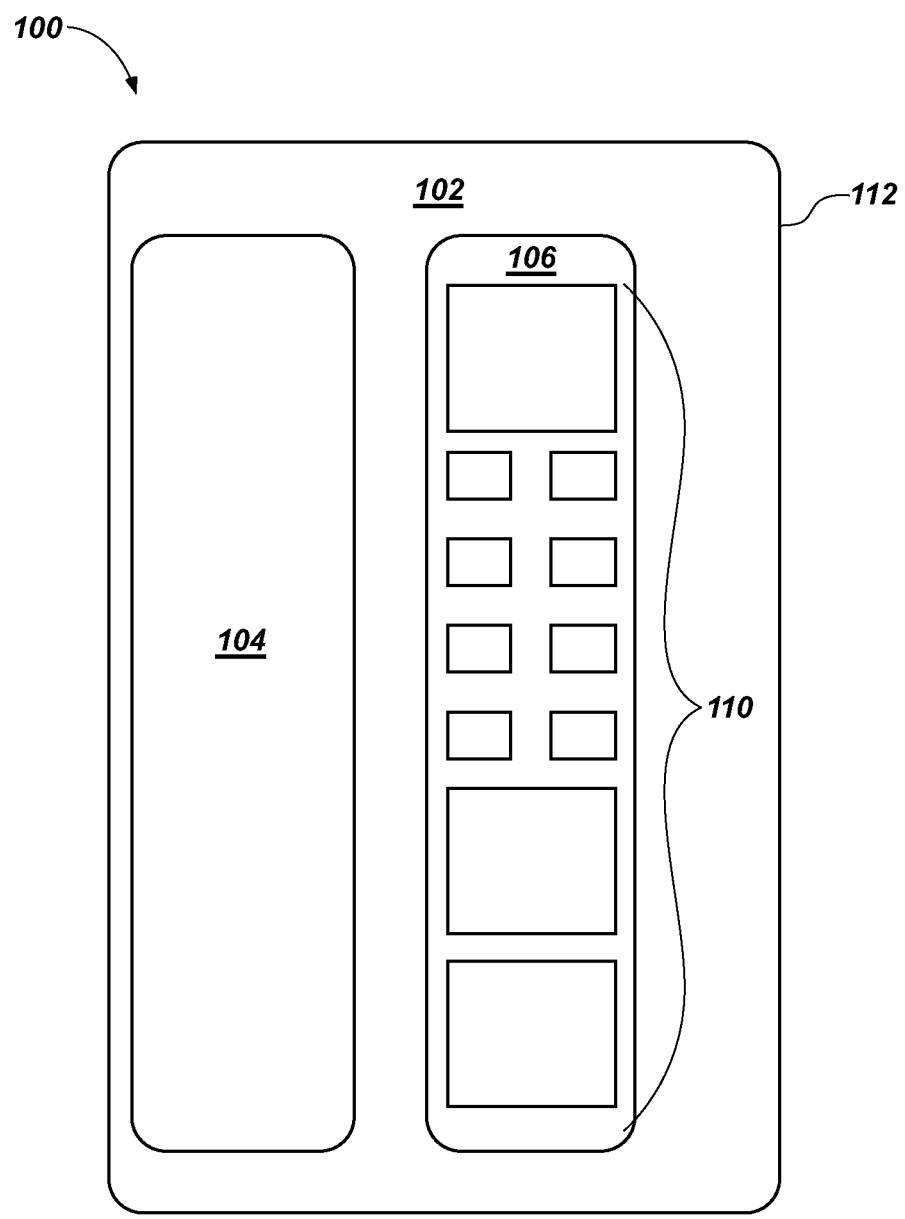
FIG. 1 is a schematic block diagram representing an interior of an electronic device.

FIG. 1 illustrates one embodiment of an interior 102 of an electronic device 100. The electronic device 100 is a physical device capable of storing and executing instructions for performing one or more functions. The electronic device 100 may be a smart phone, a personal digital assistant, a tablet, a laptop computer, a desktop computer, or other variety of electronic device 100.

The electronic device 100 typically includes a housing that defines an interior 102 and an exterior 112 of the electronic device 100. Various electronic components 110 are accessible and/or visible from the exterior 112 of the electronic device 100. For example, an electronic device 100 that is a smart phone typically includes a display that is visible from the exterior of the electronic device 100. Many of the electronic components 110, particularly sensitive electronic components 110, are situated within the interior 102 of the electronic device 100. The housing of the electronic device 100 may be designed such that a user can open or remove the housing to access the electronic components 110 to replace or service one or more electronic components 110 of the electronic device 100.

FIG. 1 illustrates an interior 102 that has a battery 104 for the electronic device 100. The battery 104 makes power available to one or more electronic components 110 of the electronic device 100. The interior 102 may also include a circuit board 106 for the electronic device 100. The circuit board 106 may be a mainboard, a motherboard (also commonly referred to as a logic board), a daughterboard or other variety of circuit board 106 providing connections between various electronic components 110 for the electronic device 100. The circuit board 106 provides mechanical support and electrical connections between the electronic components 110.

The electronic components 110 are components of the electronic device 100 that provide one or more functions for the electronic device 100. As shown in FIG. 1, at least some of the electronic components 110 may couple to the circuit board 106. The electronic components 110 may include, for example, a processor, a digital signal processor (DSP), Flash memory, DRAM, resistors, capacitors, modules, MEMS devices, microphones, speakers, connectors (audio jacks, USB, micro-USB, power), SD card readers, SIM card readers, and other varieties of electronic and mechanical components. In typical embodiments, at least some of the electronic components 110 are surface-mount technology (SMT) components that were mounted directly onto the circuit board 106 during initial assembly of the electronic device 100. The electronic components 110 that are SMT components may be connected to solder pads of the circuit board 106 by solder balls, conductive adhesives or other appropriate approaches to physically and electrically connecting the SMT electronic components 110 and the circuit board 106.

One or more electronic components 110 of the electronic device 100 may fail. The consumer may return the electronic device 100 to the retailer, manufacturer (if, for example, the failure was covered by a warranty) or another responsible party, or sell the broken electronic device 100 to a third-party. The manufacturer or third-party may choose to refurbish or remanufacture the electronic device 100 and resell the repaired electronic device 100. The entity refurbishing or remanufacturing the electronic device 100 is referred to herein as a "remanufacturer." The remanufacturer may specialize in defect refurbishment or remanufacture that requires diagnosing faulty electronic components 110 of the electronic device 100 and repairing the electronic device 100 prior to resale. In another embodiment, the refurbisher or remanufacturer may also manage electronic devices 100 that are sold as refurbished or remanufactured due to shipping or exterior damage, demonstration units, "opened box" electronic devices 100, and other electronic devices that are sold as refurbished or remanufactured even if the electronic device 100 is not faulty.

The remanufacturer may treat at least a portion of the interior 102 of the electronic device 100 with a protective coating as part of the refurbishing or remanufacturing process. For example, the remanufacturer may apply a protective coating to the circuit board 106 and at least a portion of the electronic components 110. The remanufacturer may apply the protective coating to at least one or more of the electrical connections of the electronic device 100. In this manner, the remanufacturer may add moisture resistance to the electronic device 100 in addition to repairing or otherwise assuring that the electronic device 100 is in working condition and ready for resale.

Any of a variety of metrics may be used to quantify the moisture resistance of a protective coating applied to the interior 102 of the electronic device 100. For example, the ability of a coating to physically inhibit moisture from contacting a coated feature may be considered to impart the coating with moisture resistance.

As another example, the moisture resistance of a coating may be based on more quantifiable data, such as the rate at which water permeates through the coating, or its water vapor transfer rate, which may be measured using known techniques in units of g/m²/day or in units of g/100 in²/day (e.g., less than 2 g/100 in²/day, about 1.5 g/100 in²/day or less, about 1 g/100 in²/day or less, about 0.5 g/100 in²/day or less, about 0.25 g/100 in²/day or less, about 0.15 g/100 in²/day or less, etc., through a film having a minimum thickness or an average thickness of about 1 mil (i.e., about 25.4 μm), at a predetermined temperature and relative humidity (e.g., a temperature of 37° C. and at a relative humidity of 90%; a temperature of about 90° F. and a relative humidity of about 50%, as set forth in ASTM E 96; etc.).

Another way in which the moisture resistance of a coating may be determined is by measuring a water contact angle when water is applied to a surface of the coating by an acceptable technique (e.g., the static sessile drop method, the dynamic sessile drop method, etc.). The hydrophobicity of the surface may be measured by determining the angle the base of a water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}}; \text{ and}$$

$$r_R = \sqrt[3]{\frac{\sin^3\theta_R}{2 - 3\cos\theta_R + \cos^3\theta_R}}.$$

If the surface is hydrophilic, the water will spread somewhat, forming a water contact angle of less than 90° C. with the surface. In contrast, a hydrophobic surface, which, for purposes of this disclosure, may be considered to be water-resistant, will prevent the water from spreading, resulting in a water contact angle of 90° C. or greater. The more the water beads on a surface, the greater the water contact angle. When water droplets bead on a surface such that the water contact angle with the surface is about 120° C. or more, the surface is considered to be highly hydrophobic. When the angle at which water contacts a surface exceeds 150° C. (i.e., a water droplet on the surface is nearly spherical), the surface is said to be "superhydrophobic."

Of course, other measures of water resistance may also be employed.

While the coating element(s) of a refurbishment system may be configured to apply a protective coating to exterior surfaces of one or more components of an electronic device 100 during a refurbishing or remanufacturing process, when the electronic device 100 is fully assembled, one or more surfaces on which a protective coating resides may be located within an interior 102 of the electronic device 100. Thus, a refurbishment or remanufacturing system may be configured to provide an electronic device 100 that includes a moisture-resistant coating on internal surfaces, or an internally confined protective coating.

Figure 2:
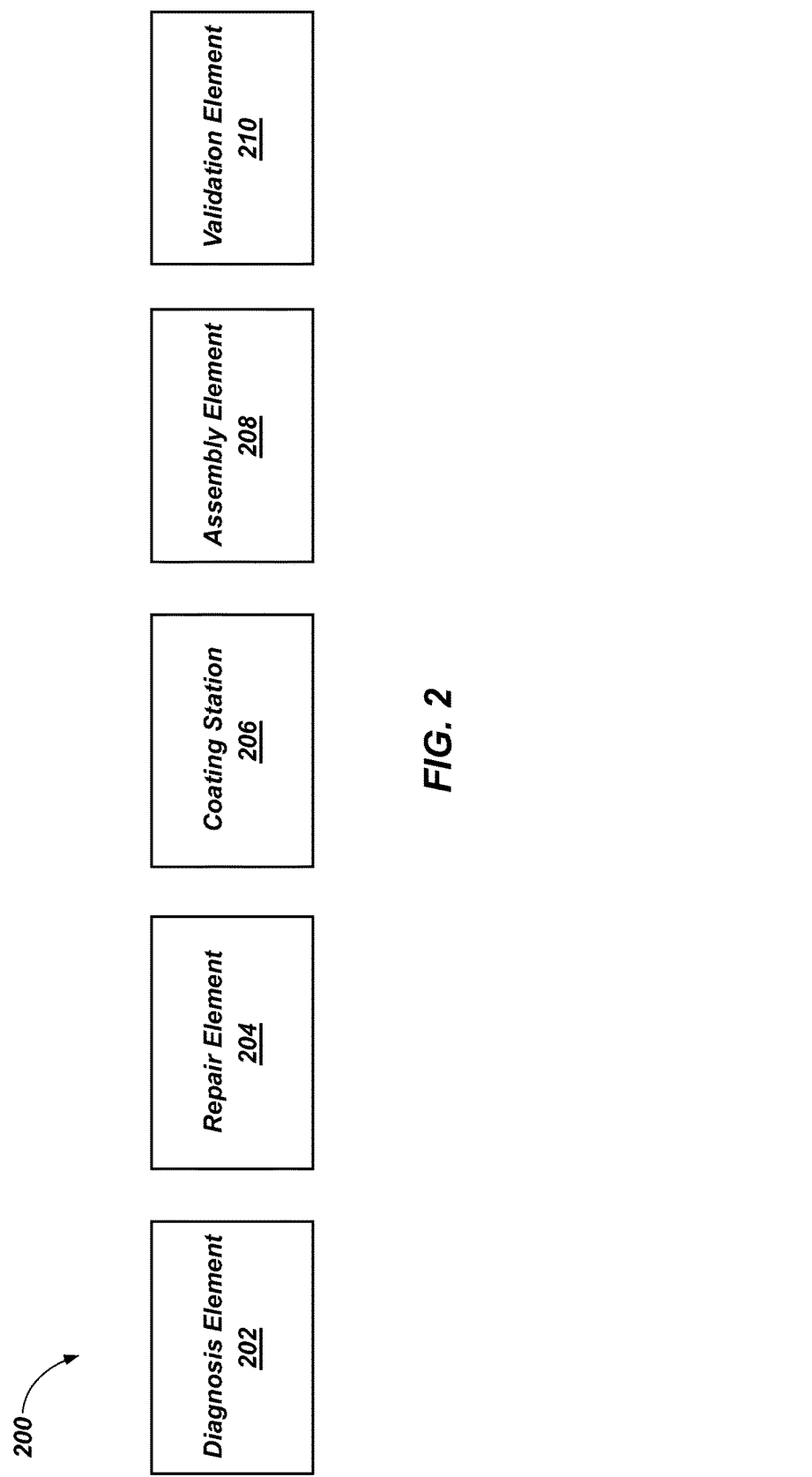
FIG. 2 is a schematic block diagram representing elements in a refurbishing or remanufacturing system that may be involved in refurbishing or remanufacturing an electronic device and providing the electronic device with moisture resistance.

FIG. 2 depicts an embodiment of a refurbishing or remanufacturing system 200. The refurbishing or remanufacturing system 200, in the depicted embodiment, includes a diagnosis element 202, a repair element 204, a coating station 206, an assembly element 208, and a validation element 210. The refurbishing or remanufacturing system 200 may be fully or partially automated. In one embodiment, at least some sections of the refurbishing or remanufacturing system 200 are implemented as an assembly line.

The diagnosis element 202 identifies one or more defective electronic components 110 within an electronic device 100. The diagnosis element 202 may comprise one or more computing devices configured to connect to the electronic device 100 or a subassembly thereof and to run one or more diagnostic tests on the electronic device 100. The diagnosis element 202 may also include one or more programs configured to execute on the electronic device 100. The diagnosis element 202 may also include one or more programs configured to collect information for a factory automation system, including part number, model number, serial number, etc. on the electronic device 100 and electronic component 110. In certain embodiments, the diagnosis element 202 provides results that are reviewed by one or more technicians to identify the defective electronic component 110. The technicians may confirm or decide which electronic components 110 are defective based on testing performed by the diagnosis element 202. For example, inspection at the diagnosis element 202 may reveal a bad capacitor. The bad capacitor may be marked for removal and replaced at the repair element 204.

The repair element 204 repairs one or more defective electronic components 110. The repair element 204 may involve fully-automated repair, partially-automated repair, or manual repair. One or more technicians may perform the repairs at the repair element 204. In certain embodiments, the housing of the electronic device 100 is removed to expose one or more defective electronic components 110 within the interior 102 of the electronic device 100. The repair element 204 may remove the defective electronic components 110 and replace the defective electronic components 110 with replacement electronic components 110.

In certain embodiments, the repairs performed by the repair element 204 are validated prior to providing a subassembly of the electronic device 100 to the coating station 206. One or more diagnostic tests may be applied to the electronic device 100 or to a subassembly thereof that was subject to repair. If the diagnostic tests indicate one or more faults even after the repair element 204 has repaired a previously-diagnosed defective electronic component 110, additional repairs may be made until the diagnostic tests determine that the electronic device 100 or the subassembly under test is operating within acceptable parameters. In one embodiment, the repaired electronic device 100 (or subassembly) is returned to the diagnosis element 202 in order to be tested and validated.

Additional steps may also be taken at the repair element 204. In one embodiment, a technician verifies that the electronic components 110 are authentic electronic components 110; for example, a technician may verify that electronic components 110, such as the processor and memory, bear an appropriate seal of authenticity. A technician may further validate the electronic components 110 against a bill of materials for the electronic device 100. The interior 102 may also be cleaned at the repair element 204.

In certain embodiments, a subassembly of the electronic device 100 is removed at the repair element 204. For example, a subassembly comprising the circuit board 106 and the electronic components 110 connected thereto via surface mounts and/or through-holes and/or mechanical connectors may be removed at the repair element 204. The subassembly may be provided to the coating station 206.

The coating station 206, which may be on-line with other (re)assembly line components or off-line, applies a protective coating to at least a portion of the electronic device 100 being refurbished or remanufactured. The coating station 206 may receive the subassembly of the electronic device 100 and apply a protective coating to at least a portion of the subassembly. The coating station 206 may apply the protective coating to at least the electrical connections (such as conductive traces) of the subassembly. The coating station 206 may also apply the protective coating to one or more of the electronic components 110 of the subassembly. One embodiment of the coating station 206 is described in greater detail below.

In certain embodiments, the coating station 206 applies the protective coating to electronic components 110 that are to be used as replacements for defective electronic components 110. As a result, a variety of pre-coated electronic components 110 may be available for use in the refurbishment or remanufacturing process. A technician or machine may attach a pre-coated electronic component 110 to the circuit board 106 of the electronic device 100 as a replacement for a defective electronic component 110. The coating station 206 may apply an additional protective coating to the entire subassembly of the electronic device 100 after the pre-coated replacement electronic component 110 is attached. The additional protective coating may provide moisture resistance to each of the electronic components 110 in the subassembly being treated, and may further provide a protective coating over the connective material (such as solder) connecting the pre-coated replacement electronic component 110 and the circuit board 106.

The refurbishing or remanufacturing system 200 may also include an assembly element 208. In the assembly element 208, a variety of components (i.e., all of the other components of the electronic device 100) may be assembled with the subassembly to build a complete, refurbished or remanufactured electronic device 100. The components that are added by the assembly element 208 may include electronic components 110, user interface features, and/or housing elements. The assembly element 208 may include automated components, manual components (i.e., where individuals assemble and/or electrically couple electrical components 110 to the circuit board 106), or a combination of automated components and manual components.

The electronic device 100 may be further configured with up-to-date software and/or firmware at the assembly element 208. The assembly element 208 may additionally restore factory default settings for the electronic device 100 and any software thereon, and ensure that any previous data stored on the electronic device 100 is overwritten or otherwise permanently removed or rendered inaccessible. The assembly element 208 may also clean, polish, buffer, re-paint, or otherwise treat exterior components of the housing for the electronic device 100 to prepare the electronic device 100 for resale.

The refurbishing or remanufacturing system 200 may also include a validation element 210. The validation element 210 may perform additional tests after the assembly element 208 produces the complete, refurbished or remanufactured electronic device 100. The validation element 210 may cause one or more diagnostic tests to execute on the hardware of the electronic device 100. The validation element 210 may further perform external testing and measuring to validate the performance of the electronic device 100. The validation element 210 may involve technicians executing the tests, checking the electronic device 100 for blemishes, and/or other actions.

Once the electronic device 100 is validated by the validation element 210, the electronic device 100 may be moisture-resistant and ready to be sold as a refurbished or remanufactured electronic device 100. The refurbishing or remanufacturing system 200 may also include one or more machines or stations where the electronic device 100 is repackaged in appropriate packing, along with appropriate connectors and peripherals, and made ready for final sale.

The refurbishing or remanufacturing system 200 may be configured as an assembly line. One or more of the processes described above may be automated or semi-automated. For example, the process of repackaging the electronic device 100 may be a fully automated process. Other aspects described above, such as diagnosing defective electronic components 110, may involve some level of involvement by a technician. Still other functions, such as executing the repair, may be performed by a technician.

Figure 3:
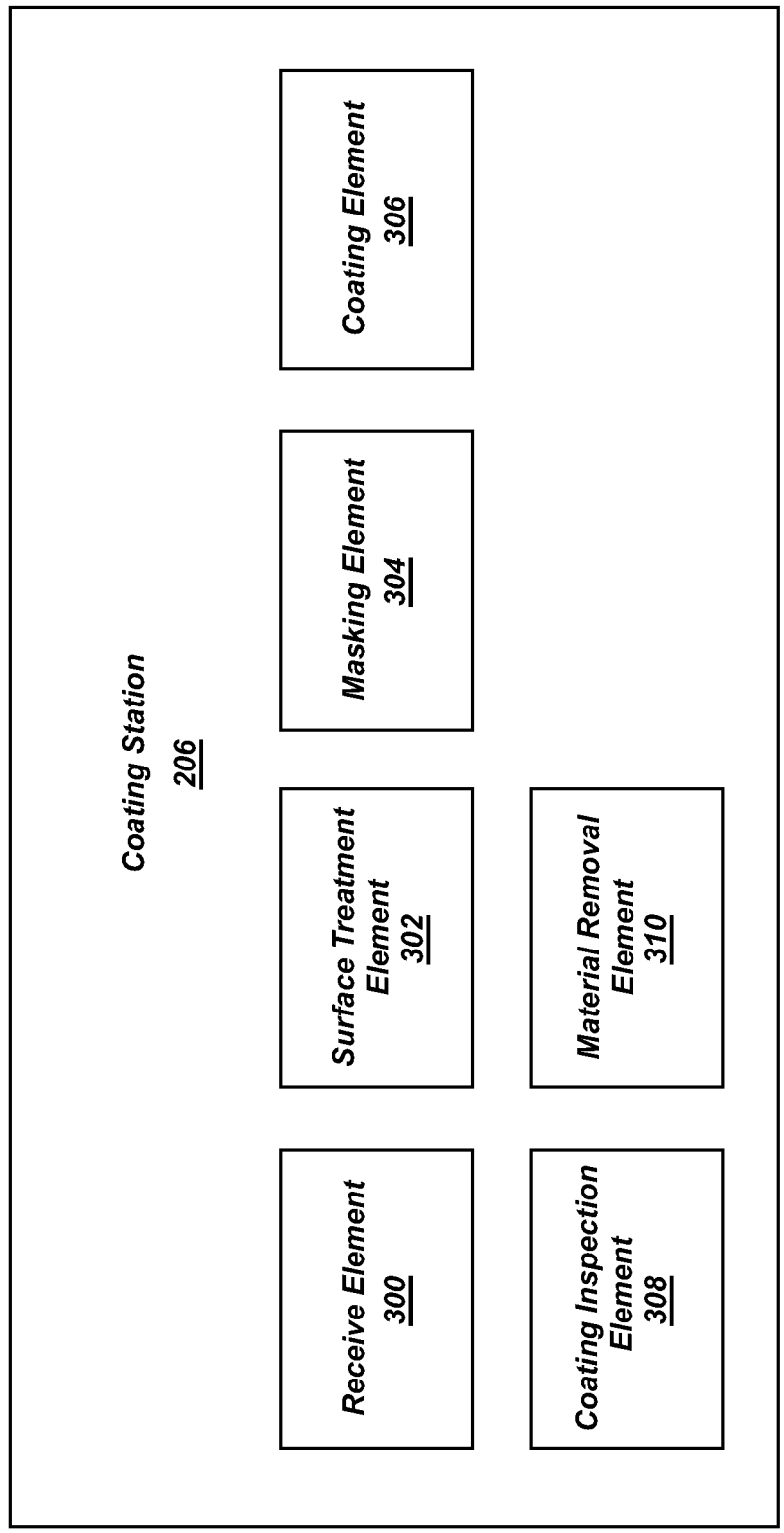
FIG. 3 is a schematic block diagram illustrating one embodiment of a protective treatment element for providing moisture resistance to refurbished or remanufactured electronic devices.

FIG. 3 illustrates one embodiment of a coating station 206 discussed in connection with FIG. 2. Other embodiments of a coating station 206 may also be used.

The coating station 206 may include a receive element 300 for receiving the electronic device 100, a subassembly thereof, an individual electronic component 110, or a piece of the electronic device 100 that may be beneficially treated with a protective coating. The receive element 300 may include a conveyor of a type known in the art, which moves the item to be treated through the appropriate elements of the coating station 206. In another embodiment, the receive element 300 may include one or more doors for a coating station 206 that shut the item to be treated into an appropriate chamber.

The coating station 206 may include a surface treatment element 302. The surface treatment element 302 may be located upstream from a coating element 306. The surface treatment element 302 may be configured to prepare a surface of the subassembly of the electronic device 100 for application of the moisture-resistant coating. In some embodiments, a surface treatment element 302 may be configured to enhance adhesion of a moisture-resistant coating to at least a portion of the subassembly. A surface treatment element 302 may be configured to modify a surface of at least a portion of the subassembly in a manner that imparts the protective coating with at least one desired characteristic (e.g., water repellency, such as a so-called "lotus leaf" structure or texture, etc.). Alternatively, or in addition, a surface treatment element 302 may clean or otherwise treat surfaces of the subassembly after a protective coating has been applied to at least portions of the subassembly.

In some embodiments, the coating station 206 includes one or more masking elements 304. A masking element 304 may be configured to mask areas of the exterior 112 and/or interior 102 of the electronic device 100 or a subassembly thereof, thus preventing a protective coating from being applied to surfaces where its application is not desired (e.g., on electrical contacts, where intermittent mechanical connection is desired, etc.). Some embodiments of a masking element 304 comprise physical masking elements, which are configured to be assembled with a component to which a protective coating is to be applied, while other embodiments of masking elements 304 are configured to deposit a selectively removable temporary mask onto a component to which a protective coating is to be applied. A coating station 206 that includes one or more masking elements 304 upstream from a coating element 306 may also include one or more demasking elements (not shown) downstream from the coating element 306 to expose features that have been masked and, thus, do not have a protective coating adhered thereto.

The coating element 306 may be configured to apply a protective coating (e.g., a coating of Parylene C, etc.) to each subassembly. The coating element 306 may be positioned at a location that ensures that a protective coating is applied to all critical features (e.g., internal components, etc.) of an electronic device under assembly 100. The coating element 306 may be positioned downstream from other refurbishment or remanufacturing operations that repair and/or replace electronic components 110 such that the coating element 306 may provide a coating on all or parts of the interior 102 and/or exterior 112 of the finished, refurbished or remanufactured, electronic device 100. Some non-limiting embodiments of coating elements 306 include molecular diffusion apparatuses, deposition apparatuses for forming reactive species that polymerize on the subassembly, or any other suitable apparatus (e.g., CVD equipment, PVD equipment, ALD equipment, an apparatus that performs a physical application process, etc.).

The inclusion of two or more coating elements 306 may further optimize the application of protective coatings to critical features of the electronic device 100. For example, a first coating element 306 may treat the interior 102 of the electronic device 100 while the electronic device 100 is still disassembled. In some embodiments, a second coating element 306 may be positioned to apply a protective coating to exposed surfaces of an assembled electronic device 100 or internally confined within, the electronic device 100 or to surfaces within an assembled electronic device 100.

The coating element 306 may comprise any of, or any combination of, a variety of coating apparatuses. In a specific embodiment, the coating element 306 may comprise an apparatus that forms reactive monomers, which monomers may then be deposited onto and form polymers on one or more surfaces that are to be made moisture-resistant or moisture-proof. In specific embodiments, the coating element may be configured to deposit poly(p-xylylene) (i.e., parylene), including unsubstituted and/or substituted units, onto one or more surfaces that are to be rendered moisture-resistant or moisture-proof. Examples of coating elements that function in this manner are described by U.S. patent application Ser. Nos. 12/104,080, 12/104,152 and 12/988,103, the entire disclosure of each of which is, by this reference, hereby incorporated herein.

U.S. patent application Ser. Nos. 12/446,999, 12/669,074, 12/740,119, and 61/615,172, the entire disclosures of all of which are, by this reference, hereby incorporated herein, also disclose embodiments of equipment and/or processes that may be employed by a coating element 306 as part of a refurbishing or remanufacturing process to form protective coatings. Various embodiments of apparatuses that may be employed as a coating element 306 include, without limitation, molecular diffusion equipment, chemical vapor deposition (CVD) equipment, physical vapor deposition (PVD) equipment (e.g., devices that employ evaporation deposition processes (including, but not limited to, e-beam evaporation, sputtering, laser ablation, pulsed laser deposition, etc.) and physical application apparatuses (e.g., printing equipment, spray-on equipment, roll-on equipment, brush-on apparatuses, etc.)) and atomic layer deposition (ALD) equipment. Of course, other embodiments of coating elements 306 may also be used.

Materials that may be applied by a coating element 306 may include, but are not limited to, thermoplastic materials, curable materials (e.g., radiation-curable materials, two-part materials, thermoset materials, room-temperature curable materials, etc.), solvent evaporation materials, etc. In some embodiments, the coating element 306 may be configured to apply a protective coating having a sufficient thickness to provide a desired level of moisture resistance within a relatively short period of time. In various embodiments, a coating element 306 may be configured to deposit a film (e.g., a Parylene film, etc.) having a minimum thickness or an average thickness of at least one micron in less than an hour, in about fifteen minutes or less, in about five minutes or less, or even in about two minutes or less. In one embodiment, the coating element 306 is configured to vaporize at least one type of [2,2] paracyclophane, to pyrolyze the [2,2] paracyclophane to form p-xylylene intermediates and to enable the p-xylylene intermediates to polymerize on the subassembly to form a poly(p-xylylene) on the subassembly.

A plurality of different coating elements 306, and even different types of coating elements 306, may be located to provide desired types of coatings on different types of features. Without limitation, one coating element 306 may be configured to provide a protective coating in small spaces between different components of an electronic device 100 (for example, between an electronic component 110 and a circuit board 106, etc.), while another coating element 306 may be configured to provide a conformal, blanketed protective coating on surfaces of the electronic device 100 that are exposed during the coating process.

The coating element 306 may be configured to apply the protective coating to a location of the subassembly where the replacement electronic component 110 is located. Where the subassembly has a previously-applied protective coating, it may be desirable to apply the protective coating only to the replacement electronic component 110 and/or the material connecting the replacement electronic component 110 and the circuit board 106. The masking element 304 may apply a mask to the other locations of the subassembly to ensure that the coating element 306 applies the protective coating only to a location of the subassembly where the replacement electronic component 110 is located.

The coating station 206 may also include a coating inspection element 308 located downstream from a coating element 306. The coating inspection element 308 may enable an analysis of the presence of a protective coating, the thickness of the protective coating, the surfaces on which the protective coating resides, the quality of a protective coating, information for a factory automation system, including part number, model number, serial number, etc., or any other useful information about a protective coating that has been applied by a coating element to an electronic device 100 and/or a subassembly thereof. Information from a coating inspection element 308 may be used to provide feedback control over a coating element 306 associated with the coating inspection element 308 or over any other component of the coating station 206.

In some embodiments, the electronic device 100 and/or a subassembly thereof may have been previously treated with a protective coating. In such circumstances, it may be beneficial to remove at least a portion of the existing protective coating as part of replacing a defective electronic component 110. For example, after removing the defective electronic component 110 and conductive material connecting the defective electronic component 110 to the circuit board 106, it may be desirable to remove any protective coating in the area of the newly-exposed contact area of the circuit board 106 in order to facilitate a good electrical and mechanical connection between a replacement electronic component 110 and the circuit board 106. Removal of solder, adhesives, conductive adhesives and subsequent cleaning of the surfaces and leads may be part of this process.

In other embodiments, it may be desirable to entirely remove a previously-applied protective coating and provide a new protective coating. It may thus be desirable to remove the previously-applied protective coating from areas of the electronic device 100 to which it was applied.

In addition, it may be desirable to remove one or more portions of a newly applied protective coating from locations of the electronic component 110 where the protective coating is not desired.

As such, in some embodiments, the coating station 206 may include a material removal element 310. The material removal element 310 may be configured to selectively remove material from one or more regions of a protective coating. Such material removal may be effected by any suitable means, without detrimentally affecting underlying or adjacent portions of the electronic device under assembly from which the material is removed. As an example, the material removal element 310 may be configured to ablate, vaporize or sublimate the material of the protective coating (e.g., with a properly placed laser beam (pulsed or continuous), etc.). As another example, the material removal element 310 may selectively apply a solvent (e.g., by inkjet processes, screen printing, etc.) that will selectively remove a material of the protective coating on an electronic device 100 or a subassembly. In yet another example, the material removal element 310 may be configured to mechanically remove material from one or more selected regions of a protective coating (e.g., by cutting, abrading, ultrasonics, etc.). Some non-limiting embodiments of such a material removal element 310 are disclosed by PCT international patent application no. PCT/US2014/010510, filed on Jan. 7, 2014 and titled REMOVAL OF SELECTED PORTIONS OF PROTECTIVE COATINGS FROM SUBSTRATES, the entire disclosure of which is hereby incorporated herein. Removal of solder, adhesives, conductive adhesives and subsequent cleaning of the surfaces and leads may be part of this process.

Figure 4:
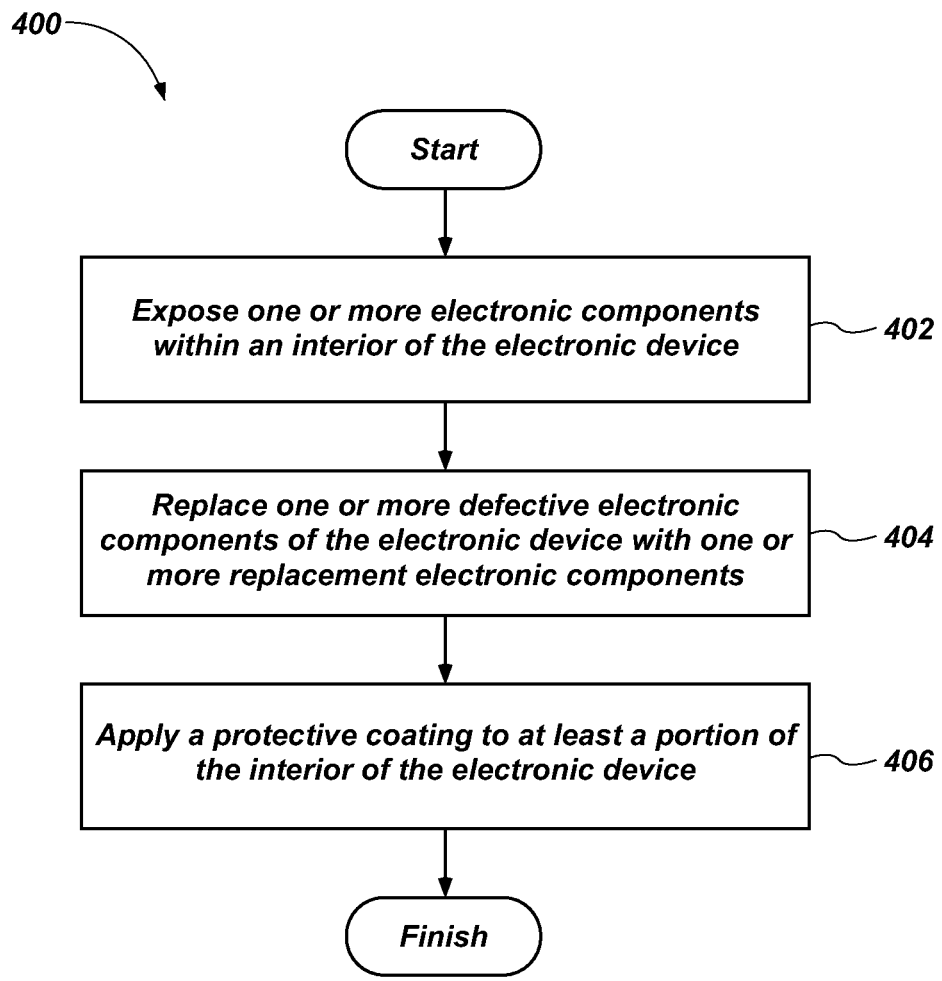
FIG. 4 is one embodiment of a method for providing a refurbished or remanufactured electronic device with a protective coating.

FIG. 4 illustrates one embodiment of a method 400 for providing a refurbished or remanufactured electronic device 100 with moisture resistance. The order in which the elements of method 400 are presented in FIG. 4 and in the text that follows merely present non-limiting examples of the flow of a process for refurbishing or remanufacturing an electronic device. In various embodiments, the method 400 may include, at reference numeral 402, exposing one or more electronic components 110 within an interior 102 of the electronic device 100. In one embodiment, a technician exposes the one or more electronic components 110 by removing all or a portion of a housing for the electronic device 100. In other embodiments, a machine removes all or a portion of the housing for the electronic device 100 to expose the electronic components 110. In other embodiments, the technician and machine may work together.

The method 400 may also involve, at reference numeral 404, replacing one or more defective electronic components 110 of the electronic device 100 with one or more replacement electronic components 110. For example, a technician may remove a defective display unit and provide a replacement display unit. In another example, a technician or machine may remove a defective capacitor from the circuit board 106 and connect a replacement capacitor. As above, the step 404 may be performed by a human technician, a machine, or some combination thereof.

The method 400 may further involve applying, at reference numeral 406, a protective coating to at least a portion of the interior 102 of the electronic device 100. For example, a coating element 306 may apply a protective coating to the circuit board 106 and the connected electronic components 110. In another embodiment, the coating element 306 may apply the protective coating to all electronic components 110 within the interior 102.

Figure 5:
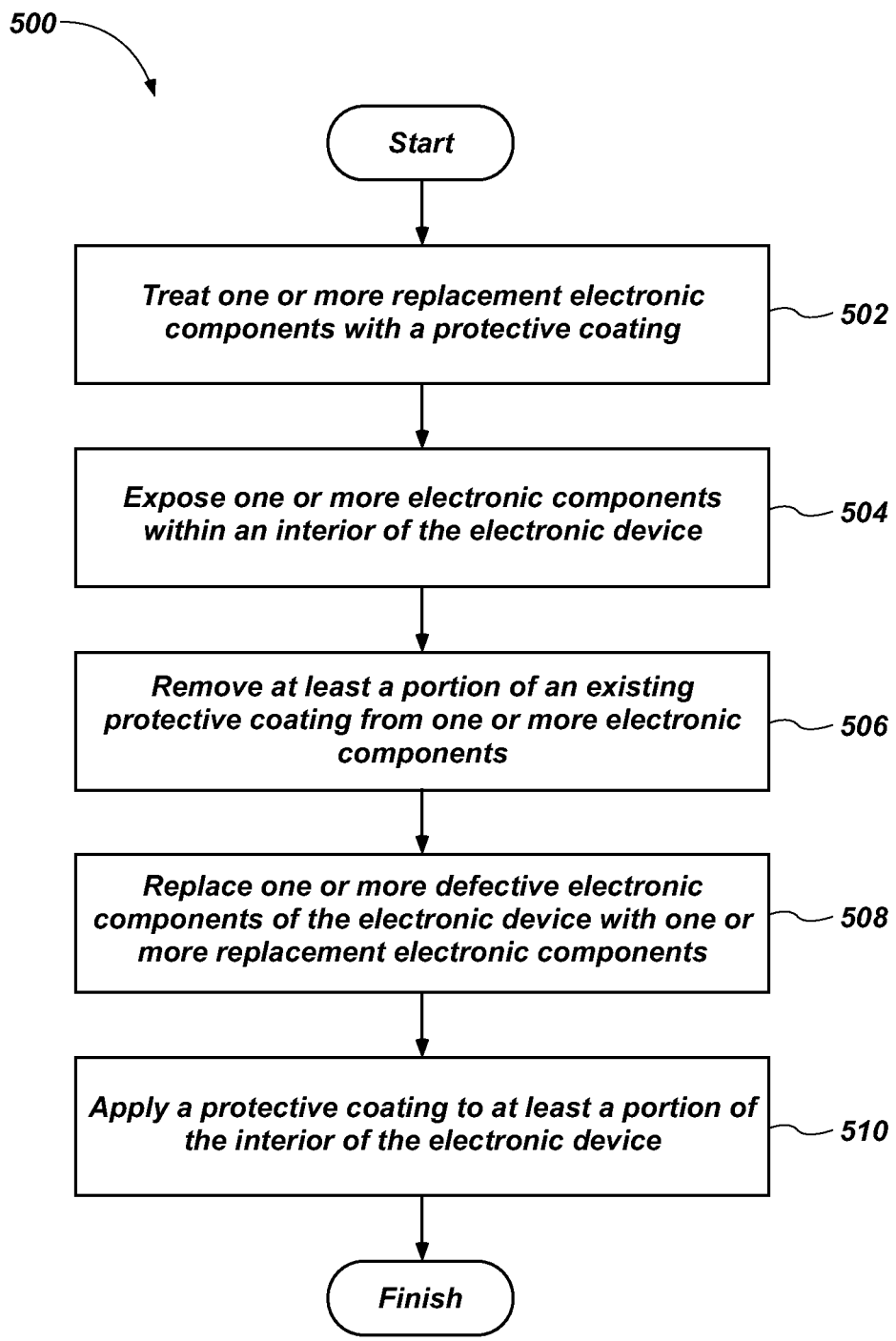
FIG. 5 is another embodiment of a method for providing a refurbished or remanufactured electronic device with a protective coating.

FIG. 5 shows another embodiment of a method 500 for providing a protective coating as part of refurbishing or remanufacturing an electronic device 100. The order in which the elements of method 500 are presented in FIG. 5 and in the text that follows merely present non-limiting examples of the flow of a process for refurbishing or remanufacturing an electronic device. The method 500 includes, at reference numeral 502, treating one or more replacement electronic components 110 with a protective coating or obtaining one or more pre-treated replacement electronic components 110. For example, one or more integrated circuits (ICs) may have a protective coating applied to them. At least a portion of the terminals of the ICs may be masked in order to allow the terminals of the ICs to be connected to solder pads of the circuit board 106.

The method 500 may further involve, at reference numeral 504, exposing one or more electronic components 110 within the interior 102 of the electronic device 110, as described above in connection with FIG. 4. The method 500 may also include, at reference numeral 506, removing at least a portion of an existing protective coating from one or more electronic components 110. To continue with the example above, the existing protective coating may be removed from at least the conductive elements of the circuit board 106 at the location of the defective IC. In one embodiment, the defective electronic component 110 is first removed, and the existing protective coating at the location on the circuit board 106 where the defective IC electronic component 110 was situated is then removed.

The method 500 may include, at reference numeral 508, replacing one or more defective electronic components 110 of the electronic device 100 with one or more replacement electronic components 110 that have been previously treated with a protective coating.

The method 500 may also include, at reference numeral 510, applying a protective coating to at least a portion of the interior 102 of the electronic device 110. In one embodiment, the protective coating is applied to at least the intermediate conductive elements (such as solder) coupling the conductive elements of the circuit board 106 with the conductive elements of the electronic components 110. Applying the protective coating may also involve applying the protective coating to substantially cover a surface of the circuit board 106, all electronic components 110 carried by the surface of the circuit board, and all intermediate conductive elements extending across the surface of the circuit board 106.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is indicated and limited only by its plain language and the full scope of available legal equivalents to its elements.

What is claimed:

1. A system for refurbishing or remanufacturing an electronic device,
the system comprising:
an access element for exposing one or more components within an interior of an electronic device;
a component removal element for removing one or more defective components from the electronic device;
a component replacement element for replacing the one or more defective components with one or more replacement components for the electronic device;
a masking element for applying a mask to features and/or components of the interior of the electronic device that are to be exposed beyond a subsequently applied protective coating; and
a coating element downstream from the masking element for applying a poly(p-xylylene) protective coating to at least a portion of the interior of the electronic device exposed through or beyond the mask and to the one or more replacement components and to the mask, the coating element being used downstream from the component replacement element.

2. The system of claim 1, wherein the coating element is also used downstream from the component removal element and upstream of the component replacement element.

3. The system of claim 1, further comprising:
a material removal component for removing at least a portion of one or more protective coatings from around the one or more defective components within the interior of the electronic device.

4. The system of claim 3, wherein the material removal component is located upstream of the component removal component.

5. The system of claim 3, wherein the material removal component is further configured to selectively remove at least the portion of the one or more protective coatings from the one or more defective components.

6. The system of claim 1, further comprising:
a diagnosis element for identifying the one or more defective components.

7. The system of claim 1, wherein the access element is configured to remove at least a portion of a housing from the electronic device.

8. The system of claim 1, wherein the access element is configured to make an opening in a housing of the electronic device.

9. The system of claim 1, wherein the mask is configured to remain assembled with said feature(s) and/or components of the interior of the electronic device.

10. The system of claim 1, wherein the one or more replacement components include a pre-coated protective coating thereon.

11. A system for refurbishing or remanufacturing an electronic device,
the system comprising:
a component removal element for removing one or more defective components from the electronic device;
a component replacement element for replacing the one or more defective components with one or more replacement components of the electronic device;
a masking element for applying a mask to features and/or components of an interior of the electronic device that are to be exposed beyond a subsequently applied protective coating; and
a coating element for applying a poly(p-xylylene) protective coating to at least a portion of the interior of the electronic device exposed through or beyond the mask and to the one or more replacement components and to the mask, the coating element being used downstream from the component replacement element and from the masking element.

12. The system of claim 11, wherein the coating element is located downstream from the component removal element and upstream of the component replacement element.

13. The system of claim 11, wherein the coating element is located downstream from the component replacement element.

14. The system of claim 13, wherein the coating element is also used downstream from the component removal element and upstream of the component replacement element.

15. The system of claim 11, further comprising:
a material removal component for removing at least a portion of one or more protective coatings from around the one or more defective components within the interior of the electronic device.

16. The system of claim 15, wherein the material removal component is located upstream of the component removal component.

17. The system of claim 15, wherein the material removal component is further configured to selectively remove at least the portion of the one or more protective coatings from the one or more defective components.

18. The system of claim 17, wherein the material removal component is configured to abrade and/or to cut the protective coating to separate the portions of the protective coating over the one or more defective components from the adjacent portions of the protective coating.

19. The system of claim 18, wherein the material removal component is located upstream of the component removal component.

20. The system of claim 18, wherein the material removal component is further configured to selectively remove at least the portion of the one or more protective coatings from the one or more defective components.

21. The system of claim 11, wherein the mask is configured to remain assembled with said feature(s) and/or components of the interior of the electronic device.

22. The system of claim 11, wherein the one or more replacement components include a pre-coated protective coating thereon.

23. A system for refurbishing or remanufacturing an electronic device,
the system comprising:
a material removal element for mechanically separating portions of a protective coating over one or more defective components of the electronic device from adjacent portions of the protective coating that are to remain on the electronic device:
a component removal element for removing one or more defective components from the electronic device; and
a component replacement element for replacing the one or more defective components with one or more replacement components for the electronic device; and
a coating element for applying a poly(p-xylylene) protective coating to at least a portion of the interior of the electronic device and to the one or more replacement components and to a mask on the electronic device, the coating element being used downstream from the component replacement element.

24. The system of claim 23, wherein the coating element is also used downstream from the component removal element and upstream of the component replacement element.

25. The system of claim 23, wherein the one or more replacement components include a pre-coated protective coating thereon.

* * * * *